(12) United States Patent
Bagheri et al.

(10) Patent No.: US 8,266,554 B2
(45) Date of Patent: Sep. 11, 2012

(54) DYNAMIC PROVISIONAL DECOMPOSITION OF LITHOGRAPHIC PATTERNS HAVING DIFFERENT INTERACTION RANGES

(75) Inventors: Saeed Bagheri, Croton on Hudson, NY (US); Francisco Barahona, White Plains, NY (US); Laszlo Ladanyi, Peekskill, NY (US); Jonathan Lee, Yorktown Heights, NY (US); David O. Melville, New York, NY (US); Alan E. Rosenbluth, Yorktown Heights, NY (US); Daniele P. Scarpazza, Dobbs Ferry, NY (US); Marc A. Szeto-Millstone, Seattle, WA (US); Kehan Tian, Poughkeepsie, NY (US); Andreas Waechter, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/204,440

(22) Filed: Aug. 5, 2011

(65) Prior Publication Data
US 2012/0047471 A1 Feb. 23, 2012

Related U.S. Application Data

(60) Provisional application No. 61/371,064, filed on Aug. 5, 2010.

(51) Int. Cl.
*G06F 17/50* (2006.01)
(52) U.S. Cl. ............... 716/51; 716/50; 716/52; 716/53; 716/54; 716/55

(58) Field of Classification Search .................... 716/50, 716/51, 52, 53, 54, 55
See application file for complete search history.

(56) References Cited

U.S. PATENT DOCUMENTS

| 6,367,053 B1 * | 4/2002 | Belk et al. ............ 716/115 |
| 2005/0091631 A1 * | 4/2005 | Gallatin et al. ........... 716/20 |

OTHER PUBLICATIONS

Nicolas Bailey Cobb, Fast Optical and Process Proximity Correction Algorithms for Intergrated Circuit Manufacturing, Spring 1998.*

* cited by examiner

*Primary Examiner* — Thuan Do
*Assistant Examiner* — Brian Ngo
(74) *Attorney, Agent, or Firm* — Scully, Scott, Murphy & Presser, P.C.; Daniel P. Morris, Esq.

(57) ABSTRACT

A method for obtaining mask and source patterns for printing integrated circuit patterns includes providing initial representations of a plurality of mask and source patterns. The method identifies long-range and short-range factors in the representations of the plurality of mask and source patterns, and provides a plurality of clips including a specified number of mask patterns. Short-range factors having overlapping ranges for each of the clips are specified. The method includes determining an initial processing priority for the plurality of clips, and determining a patterning relationship between integrated circuit patterns and the mask and source patterns. A primary objective is determined which expresses the printability of the integrated circuit patterns in terms of the patterning relationship. The method defines and iteratively solves a master problem employing the primary objective to generate values for the long-range factors, and solves subproblems employing a second objective for generating values for the short-range factors.

12 Claims, 12 Drawing Sheets

DYNAMIC PROVISIONAL DECOMPOSITION OF LITHOGRAPHIC PATTERNS HAVING DIFFERENT INTERACTION RANGES

CROSS-REFERENCE TO RELATED APPLICATION

This application claims priority under 35 U.S.C. §119(e) of U.S. Provisional Patent Applications Ser. No. 61/371,064, filed Aug. 5, 2010, the disclosure of which is hereby incorporated by reference in its entirety.

FIELD OF THE INVENTION

The present invention generally relates to the field of semiconductor manufacturing photolithography, and more particularly, to a method for improving mask and source patterns in photolithography for semiconductor manufacturing.

BACKGROUND OF THE INVENTION

Generally, semiconductor lithography includes integrated circuits built on a substrate, in a layer by layer fashion. The structure of a layer is formed by transferring a lithographically printed pattern from a light sensitive resist film onto a film of circuit material. A resist film on the substrate is imprinted by exposing it with a densely patterned lithographic image of the circuit structure. A lithographic image is an optically demagnified image of a stencil mask. The light pattern which illuminates the mask ("the source") is carefully designed along with the mask shapes to improve resolution. The source pattern is directional. The illuminating intensity is specified, for example, in each of about 200 different directions, wherein the illumination is spatially uniform across the mask. Each direction may be mirrored symmetrically into directional quadrants, for example, with the beam from each direction being mirrored across one meridional plane that contains the mask normal and the horizontal axis of the mask plane, and across a second meridional plane that contains the mask normal and the vertical axis of the mask plane.

In the semiconductor manufacturing industry, semiconductor manufacturers typically try to provide steady improvements in circuit density. Unfortunately, the exposure tools that are used to form circuit patterns have approached technological limits, and have increased in costs. Thus, one drawback in current semiconductor manufacturing is that the exposure tools provide little or no direct opportunity to provide incremental increases in circuit density. As a result, efforts to increase circuit density are focused on optimizing existing lithographic processes to make maximum use of available imaging resolution.

Existing mask data preparation logistics provide a partial framework for applying optimization to the design of mask shapes. One such process involves distributing the design of different mask regions across large numbers of processors (for example, 10K cores in the next generation of high-end dataprep hardware), considering at a fundamental level the different regions to be effectively isolated in terms of short-range interaction between different mask features. However, it is known that superior images can be achieved in optimized lithography by also including within the optimization process the directional distribution of the light that illuminates the mask, along with the variables that define the mask. Typically, the illumination pattern consists of ~100 UV light beams having independently adjustable intensity, each of which illuminates the entire mask from a particular direction. One problem with this approach is the illumination variables thus couple all mask variables together across the entire mask, making it impossible to distribute the combined mask plus illumination optimization problem across multiple processors in a simple manner. Other long-range factors pose the same difficulty (e.g., rule parameters for assisting-feature generation). This coupling from long-range factors poses a significant limitation for known methods of semiconductor manufacturing, for instance, the illumination pattern ("source") is only optimized across a very limited sample of critical layout patterns whose area is kept small enough to be processed using a single Central Processing Unit (CPU). One approach directed to this problem is to sequentially iterate between optimization of the mask (fixed source), and optimization of the source (fixed mask). However, such a limited approach can yield poor solutions compared with jointly co-optimizing the mask and source variables together. Unfortunately, current technology only allows a very small fraction of the total mask area to be co-optimized with the source.

One known source mask optimization (SMO) scheme co-optimizes the source against a limited number of mask patterns ("clips"). As used herein, a "mask clip" refers to features on at least one of the masks used to form an integrated circuit, or to form a region of an integrated circuit. As used herein, a "clip" or a "circuit clip" refers to a separate set of features in a semiconductor circuit. In this instance, the source is jointly optimized with multiple sample mask regions, each such clip being several times larger than the lens resolution. Mask variables in all clips are coupled together by source variables, hence the source must be optimized together with all mask clips. Further, the above need for combined processing makes parallelization challenging. Each source variable represents a directional component which illuminates the entire mask.

In one design example for semiconductor manufacturing, full SMO includes a number of patterns that are considered when the source is designed, but the practical limit in a joint optimization (JO) step may be a few hundred clips, and is difficult to parallelize. Large distributed memory machines (~1000 nodes) are currently used to design masks using non-NLP iterative edge re-positionings, sometimes referred to as Optical Proximity Correction (OPC); however, the source has to be fixed. SMO methodology typically assumes that the core JO optimization can be warm-started.

Known initial mask and source patterns can be inputted in one of several representations, whose entries represent problem factors (i.e., variables) with initial values. The variables may include, for example: pixel intensities in pupil grid (source); pixel amplitudes in a bitmap (mask); amplitudes in collectable mask diffraction orders (mask); polygons with edges at specified positions (mask); rules for positioning the edges of certain kinds of frequently deployed non-printing assist features (mask). Additionally, pattern variables (factors) that are long-range, and those that are short-range (spatially local) may be distinguished. Models may be available that describe the relationship between the mask and source variables, and the features that are printed in an integrated circuit being fabricated. Standard lithographic objectives can be evaluated using these models, for example expressing the deviation of the printed feature from a target, or the severity of such deviations in the presence of process fluctuations. Circuit and patterning requirements can also be expressed using these models, for example, expressing that the deviation of the printed feature from a target can be no larger than a specified requirement.

There is therefore a need to increase circuit density on a substrate for manufacturing semiconductors, for example, by optimizing use of existing technology. It would further be desirable to provide optimization methods in the field of lithography to increase circuit density in semiconductor manufacturing.

SUMMARY OF THE INVENTION

In an aspect of the invention, a method is provided for obtaining mask and source patterns for printing integrated circuit patterns on a semiconductor substrate using a computer including a non-transitory computer readable storage medium encoded with a computer program embodied therein. The method includes: providing initial representations of a plurality of mask and source patterns; identifying long-range and short-range factors in the representations of the plurality of mask and source patterns; providing a plurality of clips including a specified number of mask patterns, and specifying short-range factors having overlapping ranges for each of the clips; determining an initial processing priority for the plurality of clips; determining a patterning relationship between integrated circuit patterns and the mask and source patterns; defining a primary objective expressing the printability of the integrated circuit patterns in terms of the patterning relationship; defining and iteratively solving at least one master problem employing the primary objective with at least one cut, to generate values for the long-range factors; defining and iteratively solving subproblems employing a second objective, using the specified short-range factors from the plurality of clips having a defined processing priority, for generating values for the short-range factors and for generating the cut for the master problem; swapping the clips meeting specified high processing priority into the master problem which were associated with solving subproblems, and swapping the clips not meeting the specified high processing priority from being in the master problem to being associated with the subproblems; and generating new masks and source patterns using the values of the long-range and short-range factors according to their representations.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION OF THE INVENTION

Figure 1:
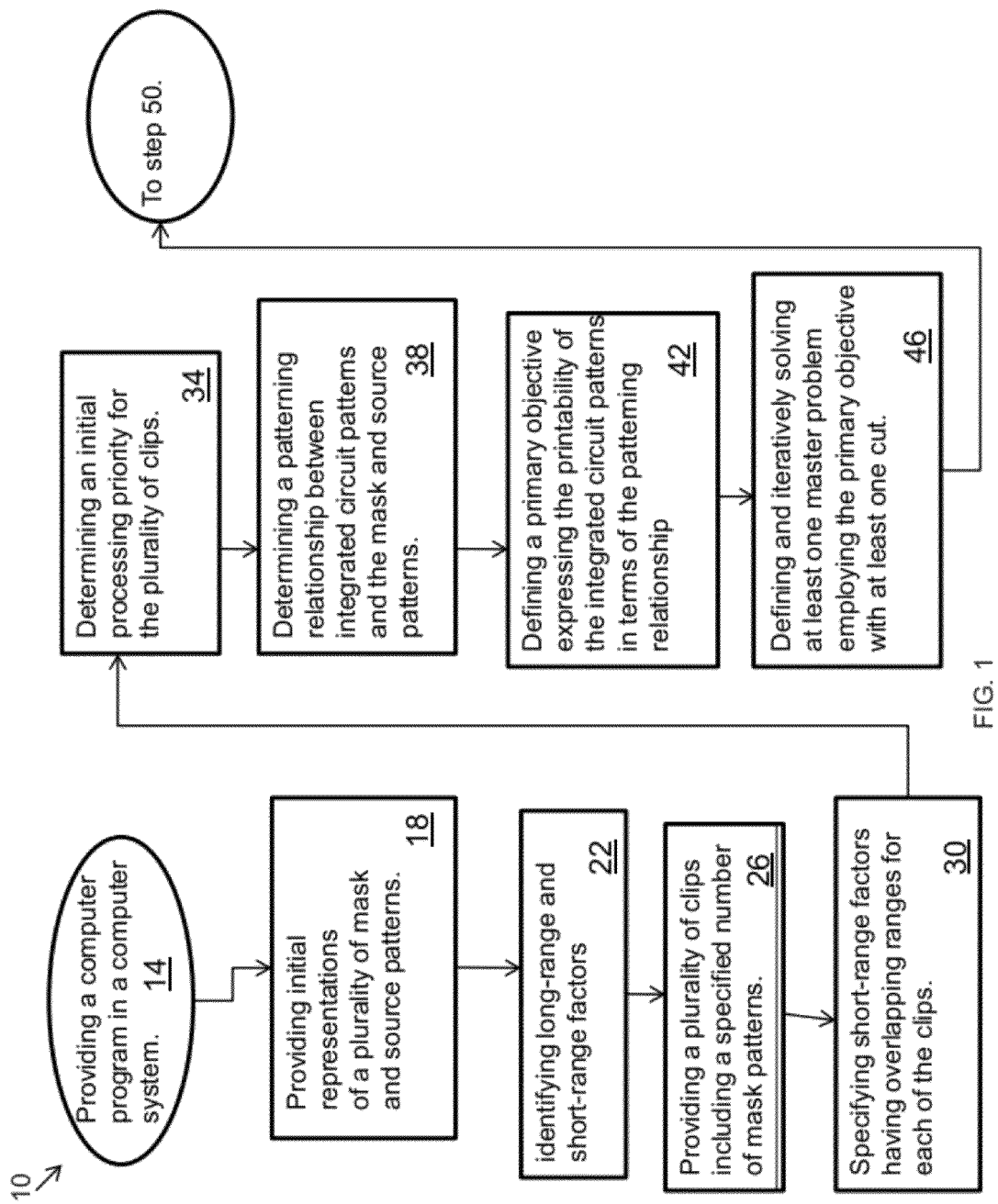
FIG. 1 is a flow chart of a method for optimizing printing integrated circuit patterns on a semiconductor substrate according to an embodiment of the invention.

According to an embodiment of a method of the present invention, pattern variables (also referred to as pattern factors) that are long-range are distinguished from variables that are short-range (spatially local) mask patterns. Source patterns (from the light pattern which illuminates the mask) are defined as one of a plurality of long-range factors (also described as long-range variables), and mask patterns are defined as one of a plurality of short-range factors (also described as short-range variables). Auxiliary max-min variables (process-window objectives) are also long-range, as are assist-feature rule parameters (e.g., nonlinear (NL) where NL denotes a variable which is typically nonlinear in the formulation). Models are used to describe the relationship between the mask and source variables, and the features that are printed on the integrated circuit being fabricated. Standard lithographic objectives can be evaluated using the models, for example, expressing the deviation of the printed feature from a target, or the severity of such deviations in the presence of process fluctuations. Circuit requirements or requirements on the patterning process can also be expressed using these models, and these expressions can serve as constraints on the long-range and short-range variables.

Initial mask and source patterns are known, and can be inputted in one of several representations, whose entries represent problem factors (i.e., variables) with initial values. For example, the variables include: pixel intensities in pupil grid (source); pixel amplitudes in bitmap (mask); amplitudes in collectable mask diffraction orders (mask); polygons with edges at specified positions (mask); rules for positioning the edges of certain kinds of frequently deployed non-printing assist features (mask).

According to the method, the long-range variables, and optionally a set of mask patterns, i.e., short-range variables, are repeatedly optimized in a master problem (MP) (or problems). In an alternative embodiment of the invention, there can be a plurality of master problems. The master problem proposes tentative targets, and tentative values for the long-range variables. One set of long range variables may be the source variables, and another set of long range variables may be defined as auxiliary variables. If constraints on the integrated circuit or patterning process are employed that involve only the long-range variables, these constraints may be included in the master problems.

Most of the mask patterns are provisionally optimized in separate subproblems, typically on separate processors. If constraints on the integrated circuit or patterning process are employed that involve the short-range variables in a subproblem, these constraints may be included in the subproblem. The probability that each particular subproblem will be processed (typically on distributed CPUs) may be dynamically adjusted. When each subproblem is solved by its processor, which is an adjustment of its own local set of short range variables, a cut may be defined. A cut is a constraint in the master problem which rules out potential solution points in regions of the master problem space that a subproblem solution has already shown to be suboptimal. The constraint multipliers for the subproblem solution indicate regions in the domain of the master problem where any new solution would be poorer than what the subproblem has already achieved at an intermediate stage of the solution process, and also regions in the master domain where the infeasibility in attaining a solution that meets the targets expressed by the auxiliary max-min variables will not yet be exhausted according to the rate at which the infeasibility was changing in the subproblem. The cut expresses restrictions on what possible values are available to the long range variables in a final overall solution. The cuts may be further defined as linear constraints in the space of the long-range master variables, and as cuts are accumulated, they more tightly approximate the exterior of the feasible region in the vicinity of the desired solution. Each cut defines a zone in the master problem space that can be excluded as a location of the final optimization solution. Cuts may be generated using factors known in the an as dual variables or multipliers, as is further described herein.

The long-range variables are fixed in the subproblems at the most recent tentative values available from a master problem solution. As new solutions for these variables are obtained from the master problems, many of the mask patterns are re-optimized in new subproblems. The cuts are derived from the subproblem solutions, and are sent to each master problem to rule out tentative values for the long-range variables. The cuts are linear constraints in the space of the long-range master variables. As cuts are accumulated, they more tightly approximate the exterior of the feasible region in the vicinity of the desired solution. When all of the subproblems are feasible no further cuts can be generated, and the final set of master and subproblem variable values can be used to generate a lithographic source and mask or masks.

Subproblems that are infeasible have an increased probability of being processed again when updated long-range variables become available from the master problems. In general, a processing policy may be applied to achieve the above. Heuristics may be used to restrict an initial subproblem population to mask patterns deemed most critical/difficult/representative. Once the source approaches convergence, a remaining larger population may be brought into the processed population at least once to test the initial (heuristic-based) assumption of feasibility. Subproblems that are strongly infeasible may be given an increased probability of being incorporated into the master problems (with associated cuts removed). The subproblem solutions approach their true optima as the master problem solutions become more accurate. The probability that each particular subproblem will be processed may be dynamically adjusted, typically giving higher priority to challenging mask regions, or optionally to subproblems that survey new mask regions once the master solution approaches convergence. When a processor is ready to run a new subproblem, a criteria is used to choose a clip for the next subproblem optimization and a criteria for selecting values of the long range variables including selecting the most recent set of values for the master problem. Subproblems may be processed on a single CPU, however, a different CPU may be used the next time the subproblem is solved.

Master problems can dynamically change by fully incorporating some subproblems (and their short-range variables), so as to directly co-optimize difficult masks with the source. The master problems and subproblems run continuously and run asynchronously. The master problem is informed of each subproblem that has been solved, and adjustments of the long range variables occur until a final optimization solution is reached. The master problem is re-run each time a new cut is inputted. Though the master is informed of each subproblem that has been solved, cuts from early solutions of subproblems may be deleted. The method of the present invention allows multiple versions of the master problem to be launched, e.g., asynchronously on different processors, however, the master providing the most recent set of long-range variables is considered the sole conceptual master. In another aspect of the method of the present invention, short range variables directed to clips are used to start solution of a new optimization problem. The short range variables are typically from masks of a previous optimization problem having an analysis of related problems and variables. Alternatively these starting short-range variables may be obtained using any other standard method of mask design. This can be used to initiate solving the new master problem which has variables related to a previous problem to quickly ascertain a reasonable starting point and initiate calculations.

Resemblance of the master problem solution to a reasonable starting solution may also be enforced by adding a penalty term to the original objective. For example, if process window is originally chosen as an objective to be maximized, this objective can be modified by adding to it, with a small negative weight, a term corresponding to the norm of the deviation of the master problem variables from their values in the starting solution. Auxiliary long-range variables may be used to define this norm. The weighting of the penalty term may be decreased as cuts accumulate.

The policy by which subproblem variables are swapped into the master problem may, in an embodiment of the invention, be a policy that swaps into the master problem those short range variables, or the clips that contain them, which are found to be strongly active in the solution process, or which are expected to potentially be strongly active. For example, if the solution process reaches a point where most subproblems are feasible using the current master problem variables, but where a few clips are found to continue generating new cuts in each iteration, the short-range variables from one or more of these clips still generating cuts may be moved into the master problem. Alternatively, clips may initially have their short-range values assigned to the master problem if these clips are expected to be important in defining the solution based on previous analysis; for example, if these clips are found to be lithographically difficult when a starting point for the optimization is determined.

In another embodiment, a simple policy for master problem processing that is fully exclusive may be used, in which no short-range variables are swapped into the master problem, i.e., swapping is not employed. In general, the policy according to which short-range variables are swapped into the master problem is referred to as a high priority processing policy.

Older cuts from subproblems that have repeatedly generated cuts may be deleted in the master problem. The initial cuts that are generated from subproblems may also be relaxed in such a way as to exclude smaller portions of the solution space. This allows for the resemblance of the solution to the starting point to not be enforced overly strongly, and helps prevent useful regions of a non-convex solution space from being removed.

Thereby, the method of the present invention provides a greater amount of clips being co-optimized with a source pattern, for example, about 1,000 clips or more co-optimized with a source pattern.

The method of the present invention provides an advantage of allowing complicating long-range source variables to be defined against a much larger sample of circuit content than is otherwise possible. The algorithmic aspects of the invention have some similarity to Benders decomposition in mathematical programming, however, differences are as follows. Incorporation of key short-range variables (NL) into the master allows warm starts, and speeds convergence. The method allows warm start from a reference solution by also generating multiple initial cuts from initial master variables that are known to be mildly infeasible by construction. The method also allows warm starts from a reference solution by providing that a term can be added to the objective which penalizes deviations from the reference solution. In the present invention master problems and subproblems are solved asynchronously, for faster updating of long-range variables. Further, the processors solve subproblems asynchronously, for efficient load balancing. The present invention avoids significant inefficiencies that arise when using Benders once most subproblems have become feasible. Finally, in the present invention, master/subproblem iterations can be carried out on a more thoroughly selected pool of layouts than could practically be processed through all iterations. A further advantage of the present invention includes providing a dramatic capacity boost by parallelizing a critical SMO bottleneck.

Figure 2:
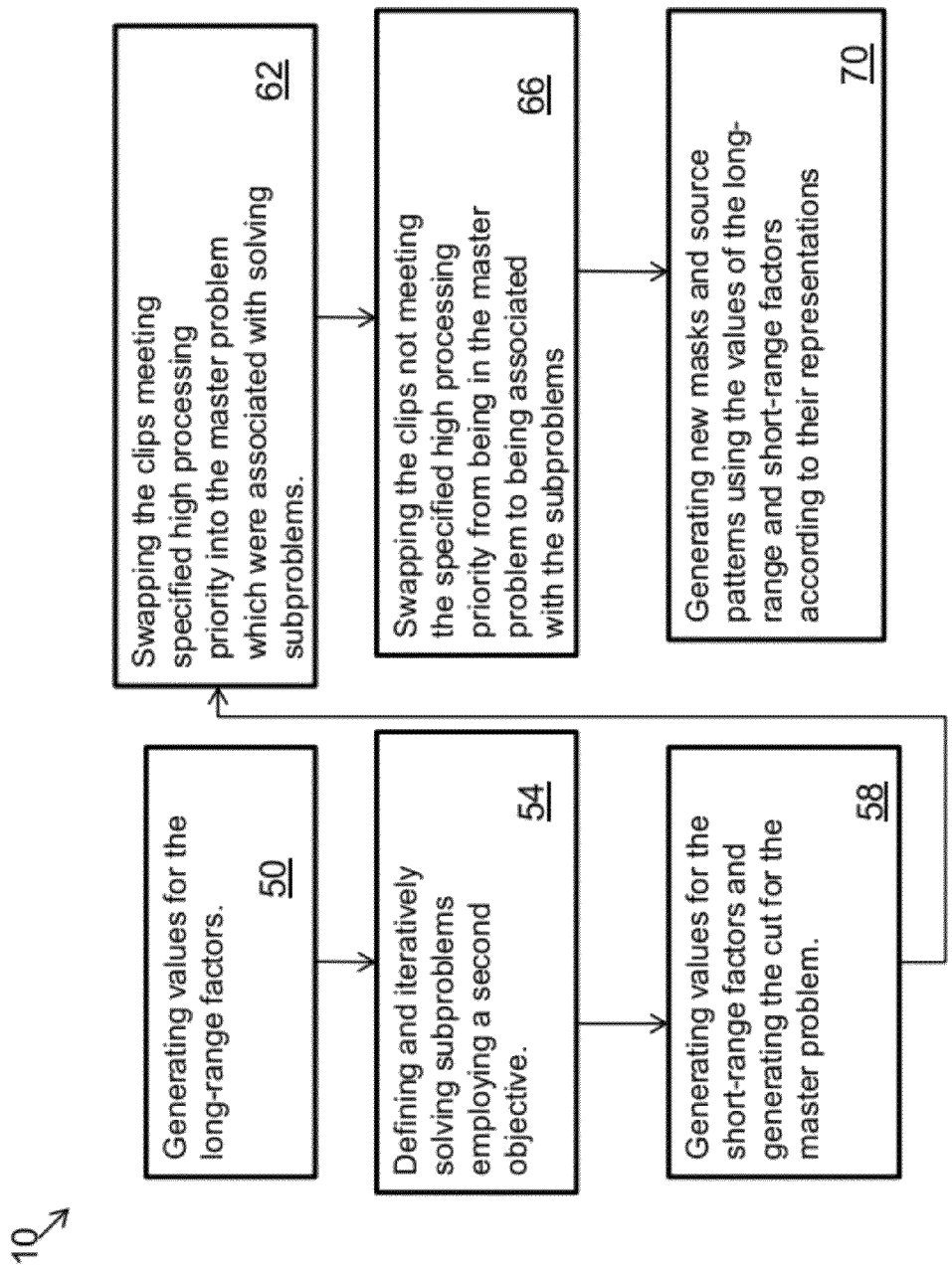
FIG. 2 is a flow chart continuing the method shown in FIG. 1.

Referring to FIG. 1, a method 10 according to an embodiment of the invention is described in light of the description and definitions of terms above. The method 10 obtains mask and source patterns for printing integrated circuit patterns on a semiconductor substrate using a computer (shown in FIG. 2) including a non-transitory computer readable storage medium encoded with a computer program embodied therein. The method 10 includes, in step 14, the step of providing a computer system. Step 18 provides initial representations of a plurality of mask and source patterns. Step 22 includes identifying long-range and short-range factors in the representations of the plurality of mask and source patterns. Step 26 provides a plurality of clips including a specified number of mask patterns. Step 30 includes specifying short-range factors having overlapping ranges for each of the clips. Step 34 includes determining an initial processing priority for the plurality of clips. Step 38 determines a patterning relationship between integrated circuit patterns and the mask and source patterns. Step 42 includes defining a primary objective expressing the printability of the integrated circuit patterns in terms of the patterning relationship. Step 46 includes defining and iteratively solving at least one master problem employing the primary objective with at least one cut. Step 50 generates values for the long-range factors. Step 54 defines and iteratively solves subproblems employing a second objective. The specified short-range factors are determined using the plurality of clips and have a defined processing priority. Step 58 also includes generating values for the short-range factors and generating the cut for the master problem. Step 62 includes swapping the clips meeting specified high processing priority into the master problem which were associated with solving subproblems. Step 66 includes swapping the clips not meeting the specified high processing priority from being in the master problem to being associated with the subproblems. Step 70 includes generating new masks and source patterns using the values of the long-range and short-range factors according to their representations. The method 10 may further include adjusting the processing priority of the clips according to a processing priority policy. Further, in another embodiment of the invention, the master problems and subproblems are solved in parallel on a plurality of processors.

Figure 3:
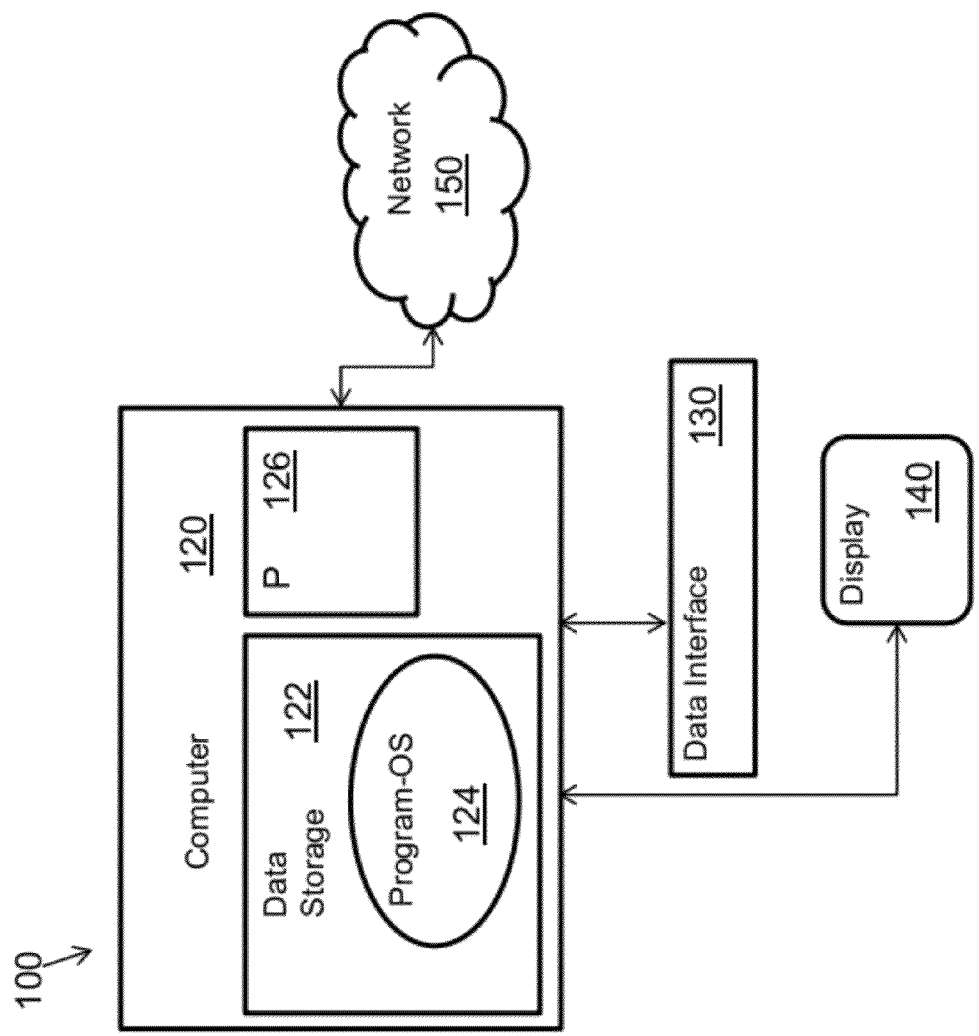
FIG. 3 is a schematic block diagram of an embodiment of a computer system for use with the method depicted in FIGS. 1 and 2.

Referring to FIG. 3, a computer system 100 according to an embodiment of the invention, may be used in conjunction with, or as part of, a server. A computer 120 includes a non-transitory computer readable data storage device 122 and a software program 124, for example, an operating system or a program implementing instructions to achieve a result. The software program or operating system 124 is stored in the data storage device 122, which may include, for example, a hard drive, or flash memory, or other non-transitory computer readable storage medium. A processor 126 executes the program instructions from the program 124. The computer 120 may be connected to a network 150, which may include, for example, the Internet, a local area network (LAN), or a wide area network (WAN). The computer 120 may also be connected to a data interface 130 for entering data and a display 140 for displaying information to a user.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagram depicted in the FIGS. illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Examples of Benders decomposition are discussed below. The examples explain and elaboration on the cuts. A cut can be defined as a constraint in the master problem which rules out potential solution points in regions of the master problem space that a subproblem solution has already shown to be suboptimal. The constraint multipliers for the subproblem solution indicate regions in the domain of the master problem where any new solution would be poorer than what the subproblem has already achieved at an intermediate stage of the solution process.

Figure 5:
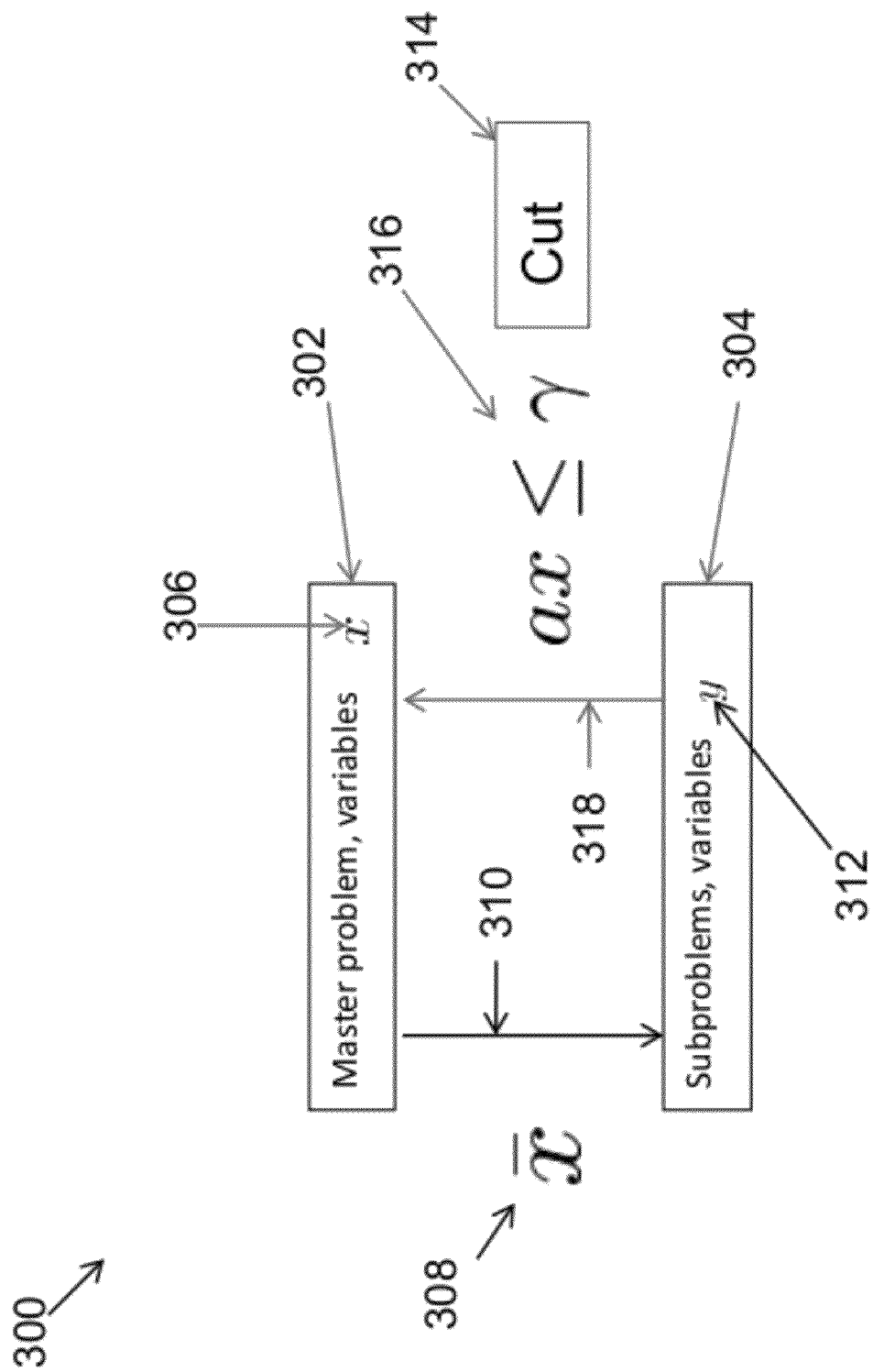
FIG. 5 is a block diagram of the interaction between a master problem and a subproblem according to an embodiment of the invention.

Referring to FIG. 5, a block diagram 300 illustrates a schematic of the basic flow structure of ASAP Benders Decomposition (nonlinear case). The upper block 302 represents the process steps in which master problem solutions are carried out, and the lower block 304 represents the steps in which subproblem solutions are carried out. The master problem variables are denoted as "x" 306, wherein x can include long-range auxiliary variables that specify a process window.

A new set of specified values for the master variables are generated each time a master problem is solved. These specified values are denoted x-bar 308 (i.e., x with an over-bar). As shown by the left arrow 310 in the figure, the latest x-bar 308 working solutions are sent to the subproblems 304, whereupon each subproblem tries to optimize a set of short-range local variables y while keeping the long-range variables fixed at x-bar. A subproblem might constitute minimization of the total infeasibility of having a certain set of mask variables "y" 312 achieve the process window values specified in x-bar 308.

When the optimized infeasibility remains positive, the subproblem 304 is infeasible, and a cut 314 is constructed from the multipliers of the infeasible constraints in the subproblem 304. This cut 314 takes the form of a linear constraint on the master variables x 306, for example having the form 316 of: a*x<=gamma. Once a cut 314 is generated, it is passed onward for later master problems to incorporate into their constraints as shown by upward pointing arrow 318. Cuts 314 may eventually be deleted or relaxed in the master problems 302 (where relaxation refers to making an increase in each gamma value).

ASAP Benders Decomposition, Nonlinear Case

---

B and F denote the usual requirements of an SMO problem.
min c x
$B(x, y) = 0$
$F(x, z) = 0$
$x, z, y \geq 0$
SMO joint optimization problem:
x denotes long range variables.
y,z denote short range variables in two clips.
For SMO joint optimization the objective contains terms like
$r_i - r_i$
and the constraints include inequalities like
$r_i \leq I_{u,t,e,i}$
(constraint for minimum intensity)
Auxiliary process window variables.

For example, B and F may include requirements that a process-window variable r be less than an intensity I (where I depends on mask and source variables).

---

ASAP Benders Decomposition, Nonlinear Case Master Problem

Master Problem
min cx
$0 \leq x \leq u$.

ASAP Benders Decomposition, Nonlinear Case Subproblem, given $\overline{X}$ $$\min \sum_i (\alpha_i + \beta_i) \quad \text{Subproblem for } y \text{ variables.}$$

$\alpha - \beta + B(\overline{x}, y) = 0$ $\alpha, \beta, y \geq 0$

If optimal value is positive, use the dual variables to derive an inequality:

$$\alpha x \leq \gamma Cut$$

is added to the master problem.

ASAP Benders Decomposition, Nonlinear Case, Cut Derivation

Subproblem, given $\bar{x}$ $$\min \Sigma_i(\alpha_i+\beta_i)$$

$$\alpha-\beta+B(\bar{x}, y)=0$$

$$\alpha,\beta \geq 0$$

If optimal value is positive, let $\bar{y}$ be an optimal solution. We use the Taylor expansion of $B(\bar{x},.)$ ASAP Benders Decomposition, Nonlinear Case, Cut Derivation The subproblem becomes $$\min \sum_i (\alpha_i + \beta_i)$$
$$\alpha - \beta + B(\bar{x}, \bar{y}) + \nabla_y^t B(\bar{x}, \bar{y})(y - \bar{y}) = 0$$
$$\alpha, \beta, y \geq 0$$

Dual variables may be obtained from so-called Lagrange multipliers of subproblem solution.

If the optimal value is positive, let $\pi$ be a dual solution, then $$\pi(-B(\bar{x}, \bar{y})+\nabla_y{}^t B(\bar{x}, \bar{y})\bar{y})>0$$

and should impose:

$$\pi(-B)(x, \bar{y})+\nabla_y{}^t B(\overline{x,y})\bar{y}) \leq 0$$

ASAP Benders Decomposition, Nonlinear Case, Cut Derivation $$\pi(-B)(x,\bar{y})+\nabla_y{}^t B(\overline{x,y})\bar{y}) \leq 0$$

Using Taylor expansion $$B(x,\bar{y}) \approx B(\bar{x},\bar{y})+\nabla_x{}^t B(\bar{x},\bar{y})(x-\bar{x})$$

obtain $$\pi(-B(\bar{x},\bar{y})-\nabla_x{}^t B(\bar{x},\bar{y})(x-\bar{x})+\nabla_y{}^t B(\bar{x},\bar{y})\bar{y}) \leq 0$$

which is detailed form of cut.

Examples are discussed below of SMO formulation prior to decomposition into master and subproblems.

Example of SMO formulation prior to decomposition into master and subproblems. Objective can be (slope-based) weakest window $P_f$, or common window $w_f$, typically summed over focus f. Note that window variables w are sometimes instead written with the symbol r.

Objective might be to maximize $\Sigma(w_{min,f}-w_{max,f})$, which can be written as minimizing c.w, where the coefficients c are +1 and −1 as appropriate, and where the w variables are a subset of the long range variables x, which also include source variables s. The objective can also be written c.x if the elements of c not associated with w variables are set to 0.

Alternately, the window objectives can be controlled by constraints, set using known/input solutions.

Intensity at a target edge $\tilde{I}_f$ may be unnormalized—It is typically a cubic function of the subproblem mask variables Y, and the master source variables s. $d\tilde{I}_f/dn$ is the intensity slope at the target edge position, also typically a cubic function of s and Y. C (capitalized) denotes the target contour for printed features.

$P_f$ may be an edge-slope metric, analogous to weakest window. Constraints govern these quantities:

$$P_f \leq L\frac{d\tilde{I}_f}{dn} + \tilde{I}_{z=0} - \tilde{I}_f \text{ in } C$$

$$P_f \leq L\frac{d\tilde{I}_f}{dn} - \tilde{I}_{z=0} - \tilde{I}_f \text{ in } C$$

$w_f=w_{min,f}-w_{max,f}$. $w_f$ is common window, defined from $w_{min,f}$ and $w_{max,f}$.

$$\tilde{I}_f + \frac{L}{2}\frac{d\tilde{I}_f}{dn} \geq W_{min,f} \text{ in } C$$

$$\tilde{I}_f - \frac{L}{2}\frac{d\tilde{I}_f}{dn} \leq W_{max,f} \text{ in } C$$

For positive f: $w_{min,f-1} \geq w_{min,f}$. For negative f: $w_{min,f-1} \leq w_{min,f}$ For positive f: $w_{max,f-1} \leq w_{max,f}$. For negative f: $w_{max,f-1} \geq w_{max,f}$ $\tilde{I}_f \leq R_f + \tilde{I}_{Average}$ in dark areas. Dark region contrast. Might only be applied in focus.

$\tilde{I}_f \geq R_f - \tilde{I}_{Average}$ in bright areas. Bright region contrast. Might only be applied in focus.

Anchor: $\tilde{I}_{Average}$ may be a constant, set from an input solution.

Intensities at offset positions from C may be used instead of differential expressions like $$L\frac{d\tilde{I}_f}{dn} + \tilde{I}_f.$$

The above constraint expressions cover all clips. In a very concise notation, the constraints and mask variables may be separated based on their clip location, with symbols y, z, . . . denoting the subset of the Y mask variables present in each clip. Similarly, B, F, . . . may be used to very compactly denote the above constraints in each clip, as B(x,y)=0, F(x,z)=0, . . .

$$S_{Min_j} \leq \sum_k p_k s_k$$

Source constraint $$0 \leq S_j \leq S_{Max_j} \qquad \text{Source constraint.}$$

An embodiment of a decomposition method according to the invention is discussed below with examples of iterations. "ASAP" is defined in the disclosure as "As Soon As Possible", and indicates that the master problem is run as soon as a processor is ready to do so, without waiting for every subproblem to be run.

Joint Optimization Problem Formulation $$\max_{s, r^-, r^+, d_i} r^- - r^+$$
$$\text{s.t.} \sum_j \text{power}_j s^{(j)} \geq s_{\min}$$
$$0 \leq s \leq 1$$
$$I^-_{i,e}(s, d_i) \geq r^- \forall_e$$
$$I^+_{i,e}(s, d_i) \geq r^+ \forall_e$$

common window
pupil fill
source pixel bounds
For each template i:
bright side of edge e
dark side of edge e
mask variable bounds

Joint Optimization Problem Formulation $$\max_{s, r^-, r^+, d_i} r^- - r^+$$
$$\text{s.t.} \sum_j \text{power}_j s^{(j)} \geq s_{\min}$$
$$0 \leq s \leq 1$$
$$I^-_{i,e}(s, d_i) \geq r^- \forall_e$$
$$I^+_{i,e}(s, d_i) \geq r^+ \forall_e$$
$$-1 \leq d_i \leq 1$$

common window
pupil fill
source pixel bounds
For each template i:
bright side of edge e
dark side of edge e
mask variable bounds
Common variables X: source variables s, minmax variables $r^+$, $r^-$
Private variables y: mask variables ($d_i$) different for each clip i

Almost Separable Problems

The simple example problem below can be solved with a algebra, and the known solution can then be used as a benchmark for an application of the present invention. In this example there are two master variables, denoted x and z. The objective in this problem is to minimize z, subject to a number of constraints that are listed in the problem statement box on page 24. The first two equations in the box involve the master variables only, and actually represent 4 constraints, namely x>=0, x<=1, z>=0, and z<=6. These four constraints are constraints of the master problem.

The next three equations in the problem statement box refer to the first of two subproblems. This first subproblem contains only one local variable, namely y1. The last three equations in the box refer to the second of the two subproblems, which contains only the single local variable y2.

The bullets below show that suboptimal results are obtained with the simple approach of alternately 1) solving the master problem with local variables fixed at their best known values, in order to improve the master variables, and then 2) solving the subproblems with the master variables fixed at their best known values, in order to improve the subproblem variables. This simple method is unable to find the known best solution for this relatively easy problem.

Benders Decomposition is an Algorithm for Solving Almost Separable Problems:

$$\min_{x, y_i} g^T x$$
$$\text{s.t. } A_x = b$$
$$x^L \leq x \leq x^U$$
$$B_i(\chi, y_i) = 0$$
$$y_i^L \leq y_i \leq y_i^U$$

Common variables: $x \in R^n$ (few)
Private variables: $y_i \in R^{m_i}$
For subproblems $i = 1, \ldots, S$
Almost separable structure:
Fix x: Gives S separate problems

Example Problem

| min z | min z |
|---|---|
| s.t. $0 \leq x \leq 1$ | s.t. $0 \leq x \leq 1$ |
| $0 \leq z \leq 6$ | $0 \leq z \leq 6$ |
| $2x + y_1^2 \leq z$ | $2x + y_1^2 \leq z$ |
| $x + 2y_1 \geq 4$ | $x + 2y_1 \geq 4$ |
| $0 \leq y_1 \leq 10$ | $0 \leq y_1 \leq 10$ |
| $4x + 2y_2^2 \leq z$ | $4x + 2y_2^2 \leq z$ |
| $3x + y_2 \geq 2$ | $3x + y_2 \geq 2$ |
| $0 \leq y_2 \leq 10$ | $0 \leq y_2 \leq 10$ |

Simple idea:
Alternately fix subset of variables:
Fix x (sources) and optimize (z, $y_i$)
In SMO: Mask-Only Optimization
Fix $y_i$ (masks) and optimize (x, z)
In SMO: Source-Only Optimization

Example Problem min z
s.t. $0 \leq x \leq 1$
$0 \leq z \leq 6$
$2x + y_1^2 \leq z$
$x + 2y_1 \geq 4$
$0 \leq y_1 \leq 10$
$4x + 2y_2^2 \leq z$
$3x + y_2 \geq 2$
$0 \leq y_2 \leq 10$ Simple idea:
Alternatingly fix subset of variables:
Fix x (sources) and optimize (z, $y_i$)
In SMO: Mask-Only Optimization
Fix yi (masks) and optimize (x, z)
In SMO: Source-Only Optimization
For this example:
Start with x = 0
Gives y1 = 2, z = 4 and y2 = 2, z = 8

-continued

Fix y1 = 2, y2 = 2
Cannot increase x without making
objective function worse
This procedure stops with x = 0, z = 8
suboptimal, even though this problem is
convex (= simple)

Figure 6:
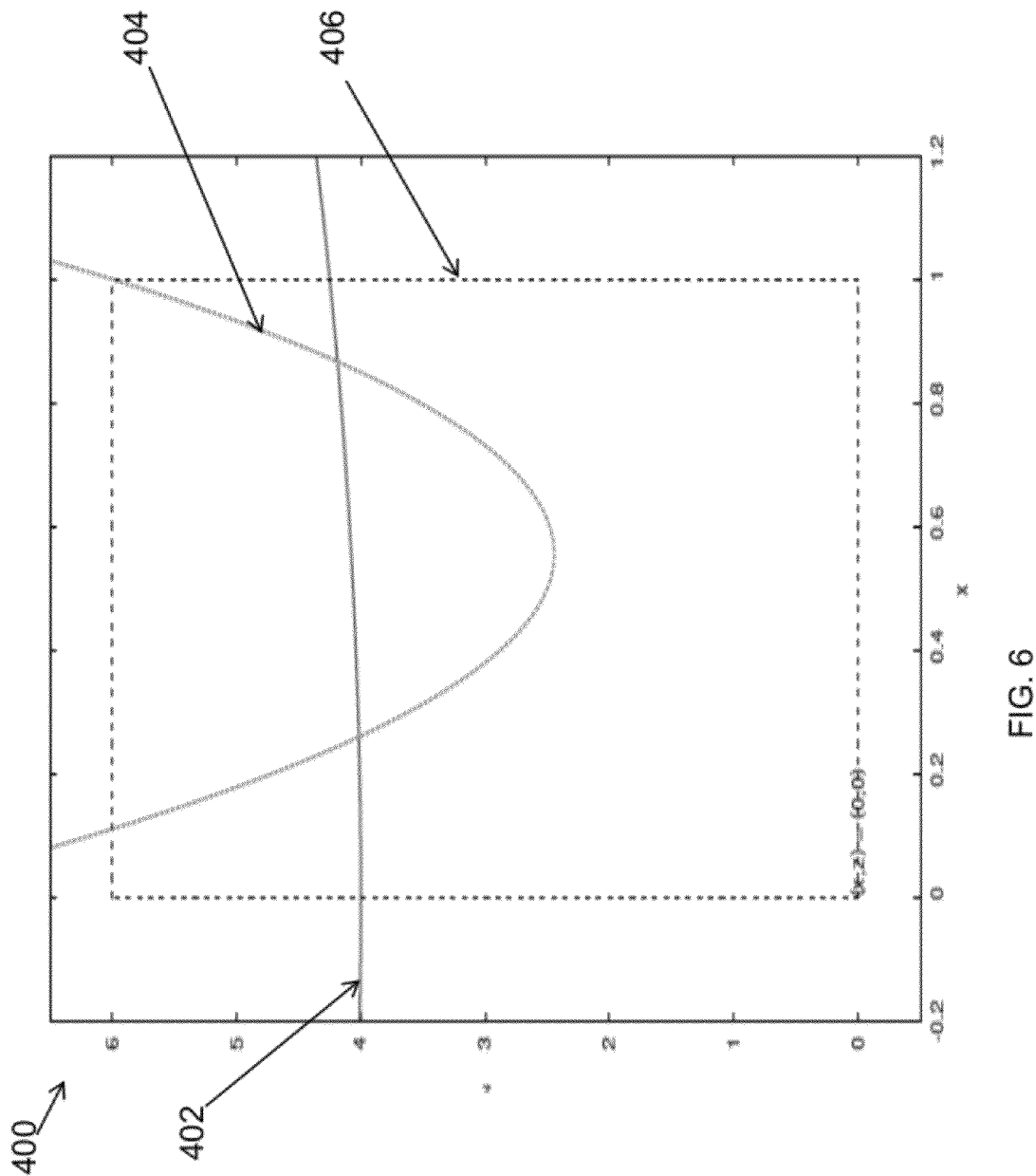
FIG. 6 is a graph depicting the domain of a master problem according to an embodiment of the invention.

Benders Decomposition: Master Problem $$\min_{x,y_i} g^T x$$
s.t. $Ax = b$
$x^L \leq x \leq x^U$
$B_i(x, y_i) = 0$
$y^L i \leq y_i \leq y_i^U$ (Linear) Master problem (MP):

$$\min_x g^T x \quad \text{(MP)}$$
s.t. $Ax = b$
$c_j^T x \leq d_j$
$x^L \leq x \leq x^U$ Only in small x space
Overestimates set of feasible x
Idea: Iteratively add "cuts" $c_j^T x \leq d_j$
to approximate F increasingly tighter
Once cuts are very tight on F, solution
of (MP) is solution for original problem Benders Decomposition: Cut Generation In each iteration: Solve (MP) to get $\bar{x}$
Check if $\bar{x}$ is feasible for constraints of
subproblem i :
Minimize infeasibility:

$$\min_{x,y_i} g^T x \quad \quad \min_{y_i} \sum_j \alpha_i^{(j)} > \beta_i^{(j)}$$
s.t. $Ax = b$ \quad s.t. $B_i(\bar{x}, y_i) + \alpha_i - \beta_i = 0$
$x^L \leq x \leq x^U$ \quad $y_i^L \leq y_i \leq y_i^U$
$B_i(x, y_i) = 0$ \quad $\alpha_i, \beta_i \geq 0$
$y_{\underline{i}}^L \leq y_i \leq y_{\underline{i}}^U$ If optimal objective of (INFi) > 0:
Compute cut $c_j^T x \leq d_j$ for (MP)
This makes $\bar{x}$ infeasible for (MP)
(Does not cut off points in F)
Otherwise: $\bar{x}$ feasible for subproblem i The example problem below ("Example: Iteration 0") is re-introduced from a problem discussed above beginning at paragraph [0067]. Referring to FIG. 6, a graph 400 shows the domain of the master problem, with master variable x plotted along the horizontal, and master variable z plotted along the vertical. The four constraints of the master problem (i.e., the first two equations in the problem statement box) require that, the x and z values of the solution lie within the black dashed rectangle. The objective of the optimization is to minimize z, i.e. to find the solution point on the graph with the lowest possible height that remains consistent with all constraints.

As noted, this example problem can be solved algebraically. To do so, note that since the objective is to minimize z, the first constraint of the first subproblem (namely 2*x+y1^2<=z) implies that y1 needs to be made as small as possible. However, the second equation of the first subproblem implies that we need to keep y1>=2−x/2. Substituting from this second subproblem equation into the first to eliminate y1, we then have that z must remain greater than 4+x^2/4, i.e. we have established that z>=4+x^2/4. This last equation is plotted as curve 402 in the graphs of FIGS. 6-12. The solution point in the graphs of FIGS. 6-12 lies on or above the curve 402.

The same logic as above is applied in a second subproblem, z must satisfy z>=8−20x+18x^2. This equation is plotted as a curve 404 in the graphs of FIGS. 6-12, i.e., the solution must lie above the curve 404 as well as the curve 402. Moreover, since the objective is to minimize z, the overall solution to the problem must lie at the leftmost intersection of the curve 402 and the curve 404. This intersection is the lowest point within the dashed rectangle 406 that lies above both the curve 402 and the curve 404. From applying algebra this intersection is found to be:

x=(4/71)*(10−Sqrt[29]),z=(40 (517−Sqrt[29]))/5041, or in numbers:
x=0.25999072, z=4.0168988.

Plugging these into the subproblems, it is found that:
y1=(2/71)*(61+Sqrt[29]), y2=(2/71)*(11+6 Sqrt[29]), or in numbers:
y1=1.8700046, y2=1.2200279.

Figure 7:
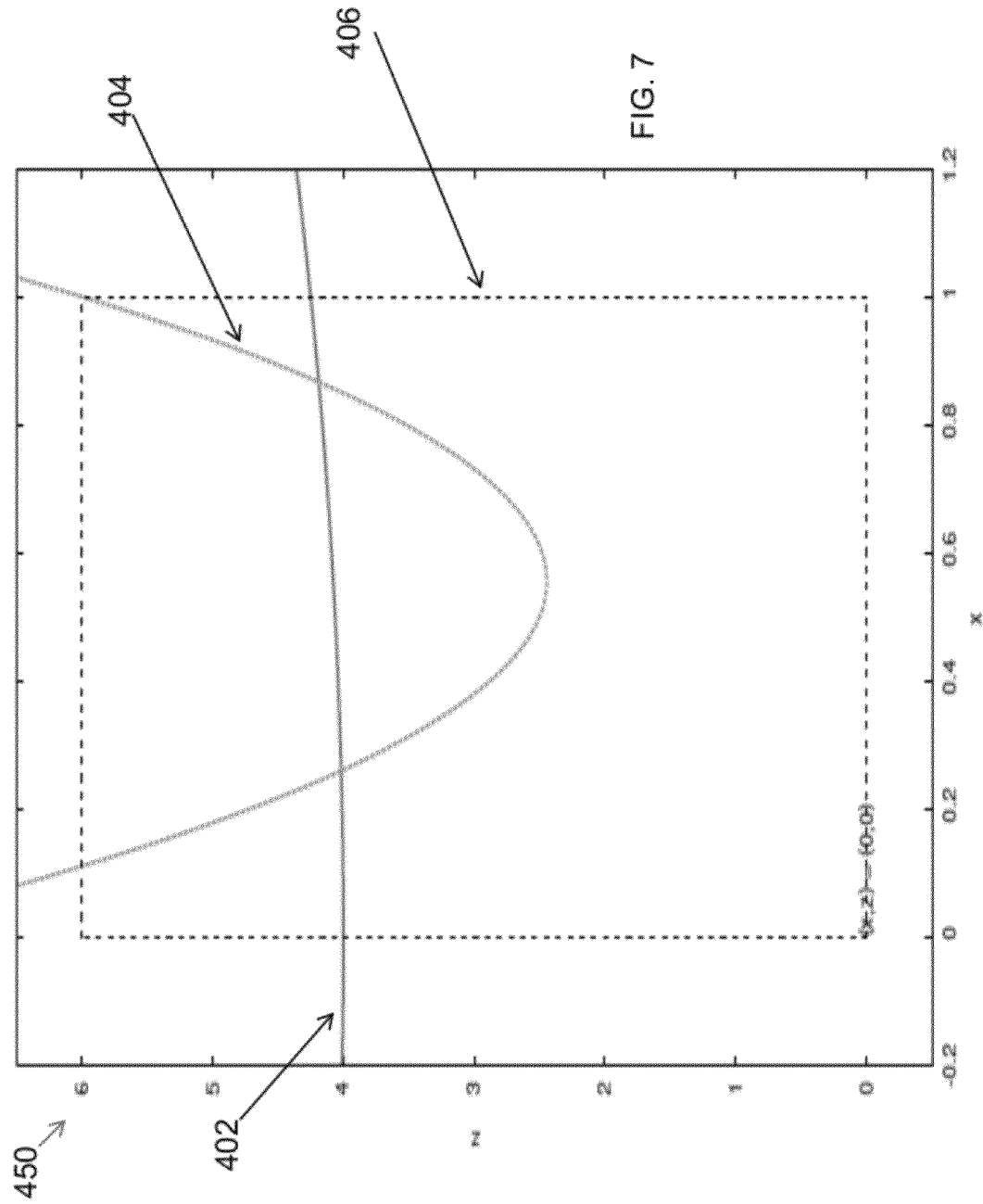
FIG. 7 is a graph depicting results of solving a master problem for a first time according to an embodiment of the invention.

Example: Iteration 0

$$\min z$$

s.t. $0 \leq x \leq 1$
$0 \leq z \leq 6$
$2x + y_1^2 \leq z$
$x + 2_{y1} \geq z$
$0 \leq y_1 \leq 10$
$4x + 2_{y2}^2 \leq z$
$3x + y_2 \geq 2$
$0 \leq y_2 \leq 10$ Next, an embodiment of the method of the invention (which can also be applied in much more complicated problems), succeeds in obtaining the optimal solution. Referring to FIG. 7 which shows a graph 450 depicting the results of solving the master problem for the first time. Since there are as yet no cuts in the master problem, the optimum master solution is found to be x=z=0.

Example: Iteration 0

$$\min z$$

s.t. = $0 \leq x \leq 1$
$0 \leq z \leq 6$
$2x + y_1^2 \leq z$
$x + 2_{y1} \geq z$
$0 \leq y_1 \leq 10$
$4x + 2_{y2}^2 \leq z$
$3x + y_2 \geq 2$
$0 \leq y_2 \leq 10$ Initial (MP):

min z s.t. $= 0 \leq x \leq 1$ $\quad 0 \leq z \leq 6$

Optimal solution $(\bar{x}, \bar{z}) = (0, 0)$

Figure 8:
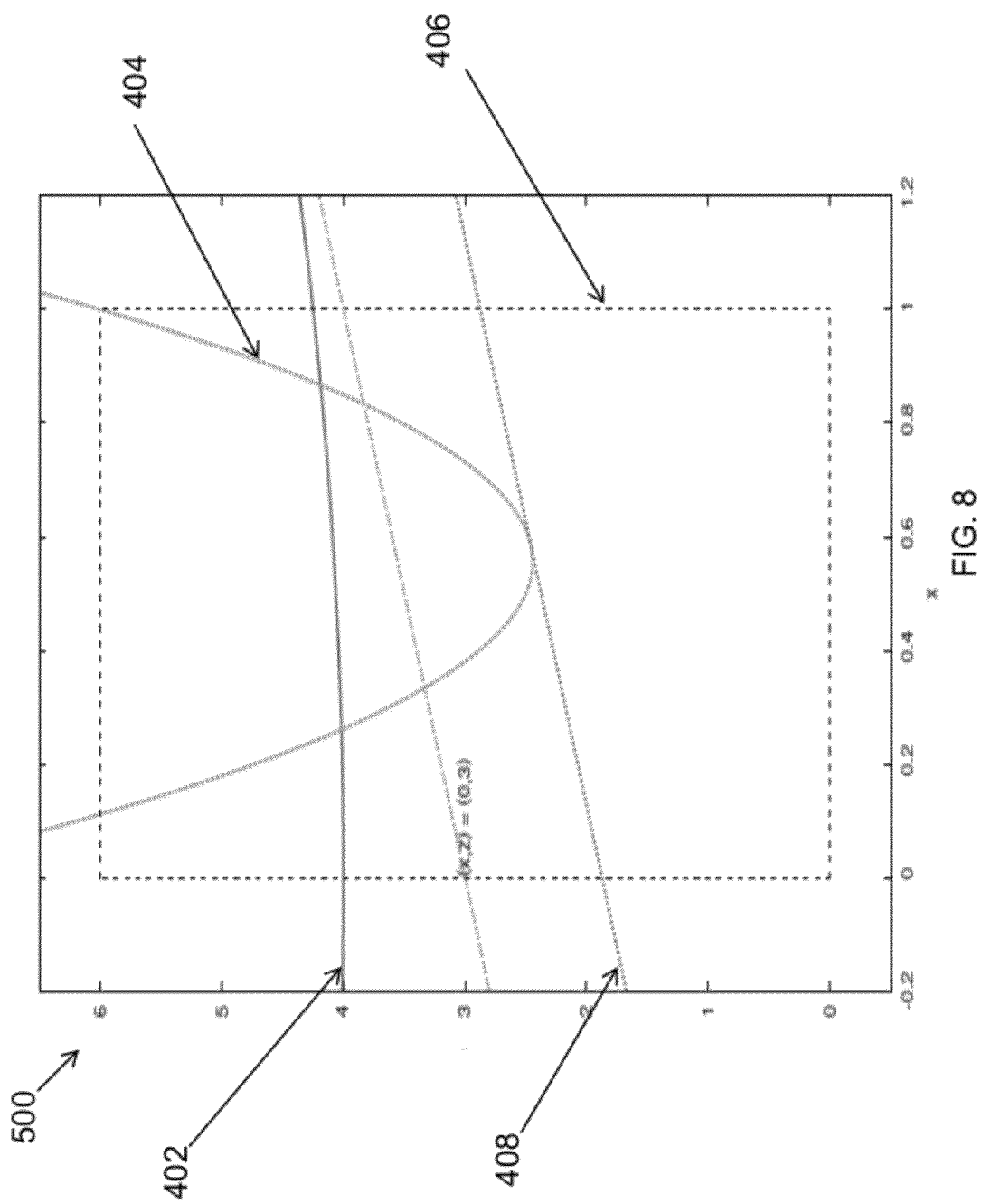
FIG. 8 is a graph depicting results of solving subproblems for the first time using master values according to an embodiment of the invention.
Figure 9:
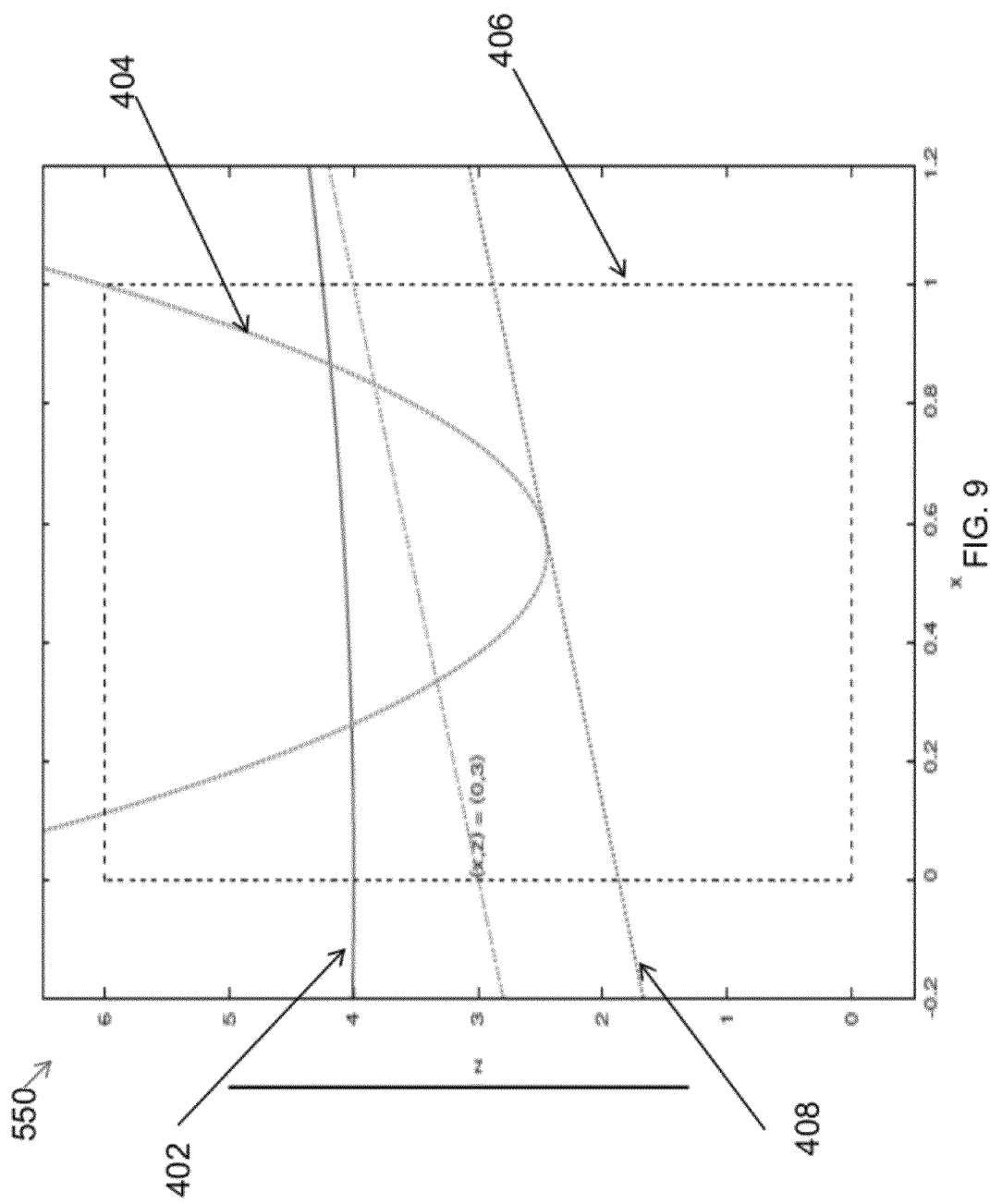
FIG. 9 is the same graph as in FIG. 8 relating to updated master problem calculations.

These master values are then passed to the subproblems, and graphs 500 and 550 of FIGS. 8 and 9 shows the results of solving the two subproblems for the first time using these master values. The first subproblem has four constraints, as shown below, corresponding to the 3rd, 4th, and 5th equations in the problem statement box (the last of which represents two constraints, y1>=0 and y1<=10). With x and z set to the latest specified master values of x-bar=0 and z-bar=0 (where the overbar indicates that these are the fixed values obtained from the master), the smallest total infeasibility that can be obtained is 3, which occurs when y1=1. In that case the remaining infeasibility in the first subproblem constraint is given by 2*x-bar+y1^2-z-bar which is 1, and the remaining infeasibility in the 2nd subproblem is 4-x-bar-2*y1, which is 2. The 3rd and 4th constraints are satisfied (with margin to spare), i.e. they contribute no remaining infeasibility.

It can be shown that the multiplier for any subproblem constraint which remains infeasible is 1, and the multiplier for any subproblem constraint which is satisfied with positive margin is 0. Therefore the total infeasibility for this subproblem solution is found by adding the first and second constraint values, which sum to 3 at the subproblem solution. Because the subproblem is infeasible a cut is generated. Since this cut is introduced in the master problem space, the values of x and z must next be considered as master variables that can deviate away from x-bar=0 and z-bar=0 when the master problem is solved again. The total infeasibility in the subproblem can now be written as:

(2*x+y1^2−z)+(4−x−2*y1).

This simplifies to 3+x−z, which in this simple example already has almost the form of a cut. To explain how an embodiment of the invention works in the general case, the rate of change of the infeasibility with respect to the master variables is considered.

At this subproblem solution y1=1, and the total infeasibility is 3. The rate at which the infeasibility is changing has two components in the master space, namely the derivative with respect to x, which according to the previous equation is 1, and the derivative with respect to z, which is −1. These are the rates at which the infeasibility increases, which is the negative of the rate at which the infeasibility is being exhausted. Therefore, these derivatives must be multiplied by a factor of −1 to express the rate of exhaustion. The cut expresses the requirement that the total subproblem infeasibility in attaining a solution that meets the constraints (this being 3 at the current subproblem solution) must at the new master solution be fully exhausted at the rate at which the infeasibility was changing in the subproblem. In mathematical form, this requirement is:

3<=−1*(1*(x−x-bar)+−1*(z−z-bar)).

In other words, the cut requires that the new master solution point move far enough from the previous master solution that the previous subproblem infeasibility is exhausted, based on the rate in the master space at which the infeasibility was being exhausted at the subproblem solution. Noting that x-bar=z-bar=0, the cut produced by the subproblem simplifies to:

x−z<=−3.

This cut is plotted as curve 402 on the graphs of FIGS. 6-12. The cut requires that any solution lie above the curve 402. Similarly, the second subproblem shown below, generates a cut x−z<=−1.875, which is represented by line 408 in the graphs of FIGS. 8-12.

Example: Iteration 1 min z s.t. $0 \leq x \leq 1$ $0 \leq z \leq 6$ $2x + y_1^2 \leq z$ $x + 2y_1 \geq 4$ $0 \leq y_1 \leq 10$ $4x + 2y_2^2 \leq z$ $3x + y_2 \geq 2$ $0 \leq y_2 \leq 10$ Current (MP) solution:
$(\bar{x}, \bar{z}) = (0, 0)$
Subproblem 1:
Infeasibility: 3
Cut generated
x − z ≦ -3
Subproblem 2:
Infeasibility: 1.875
Cut generated
x − z ≦ -1.875

The graph 550, and associated formula and text below, shows that when the master problem is re-solved after adding these two cuts, the resulting master solution is x=0, z=3. This point is labeled on the graph. This master solution is the lowest point within the dashed box which lies above both the red and blue cut lines. Note that the two parabolas (red and green), which, as have been shown, can be found algebraically in this test case, are not part of the master problem. They are only included on the graph for convenience. The leftmost intersection of these parabolas is the true optimum of the optimization problem, and it can be seen that the second master solution comes closer to this true optimum than did the first master solution at x=0, z=0. It should also be noted that to simplify the presentation, solving the master problem asynchronously in this example is left out. For the sake of clarity, each subproblem is solved before re-running the master instead.

Figure 10:
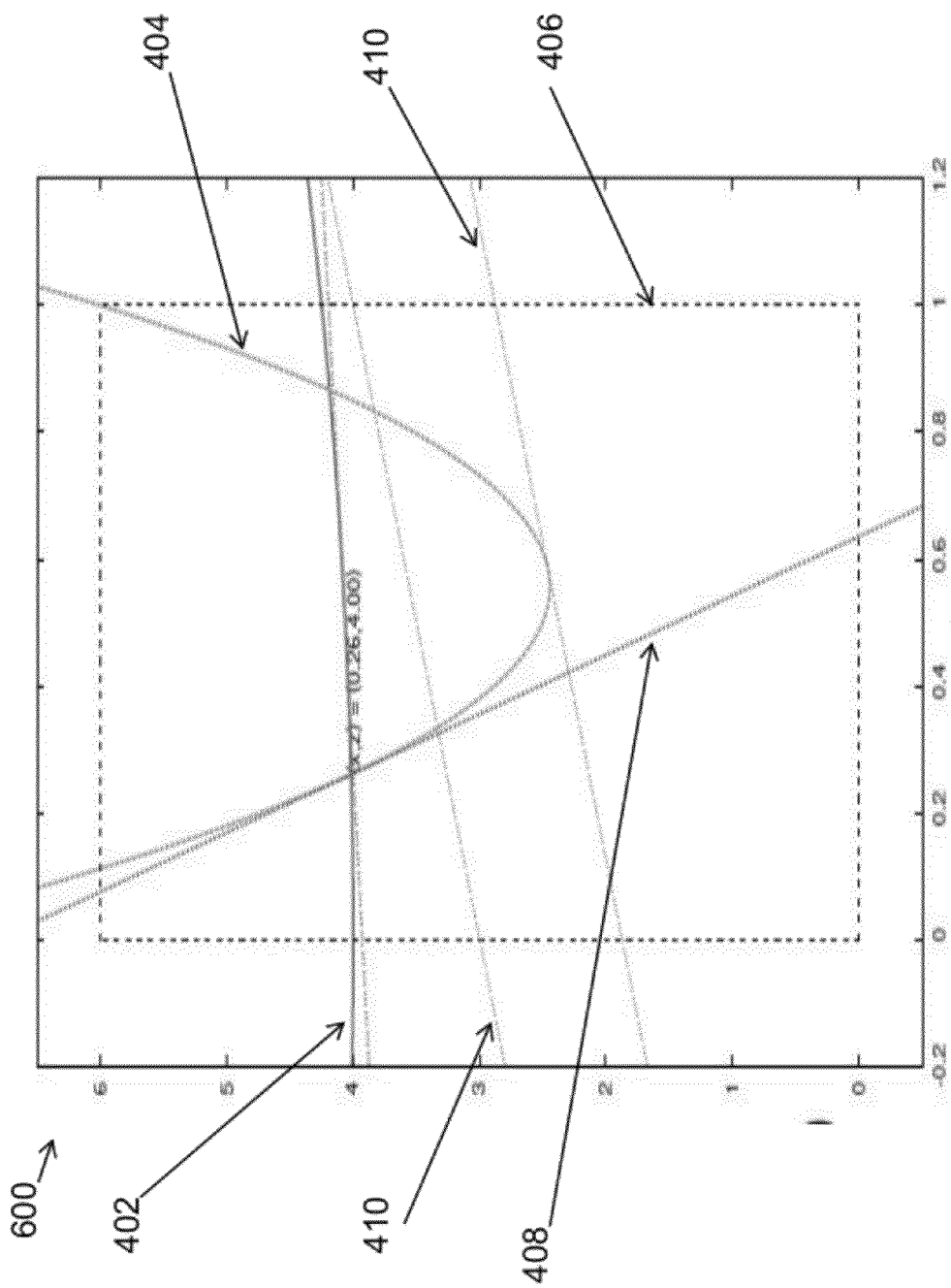
FIG. 10 is a graph depicting results of a complete subproblem-master problem iteration according to an embodiment of the invention.
Figure 11:
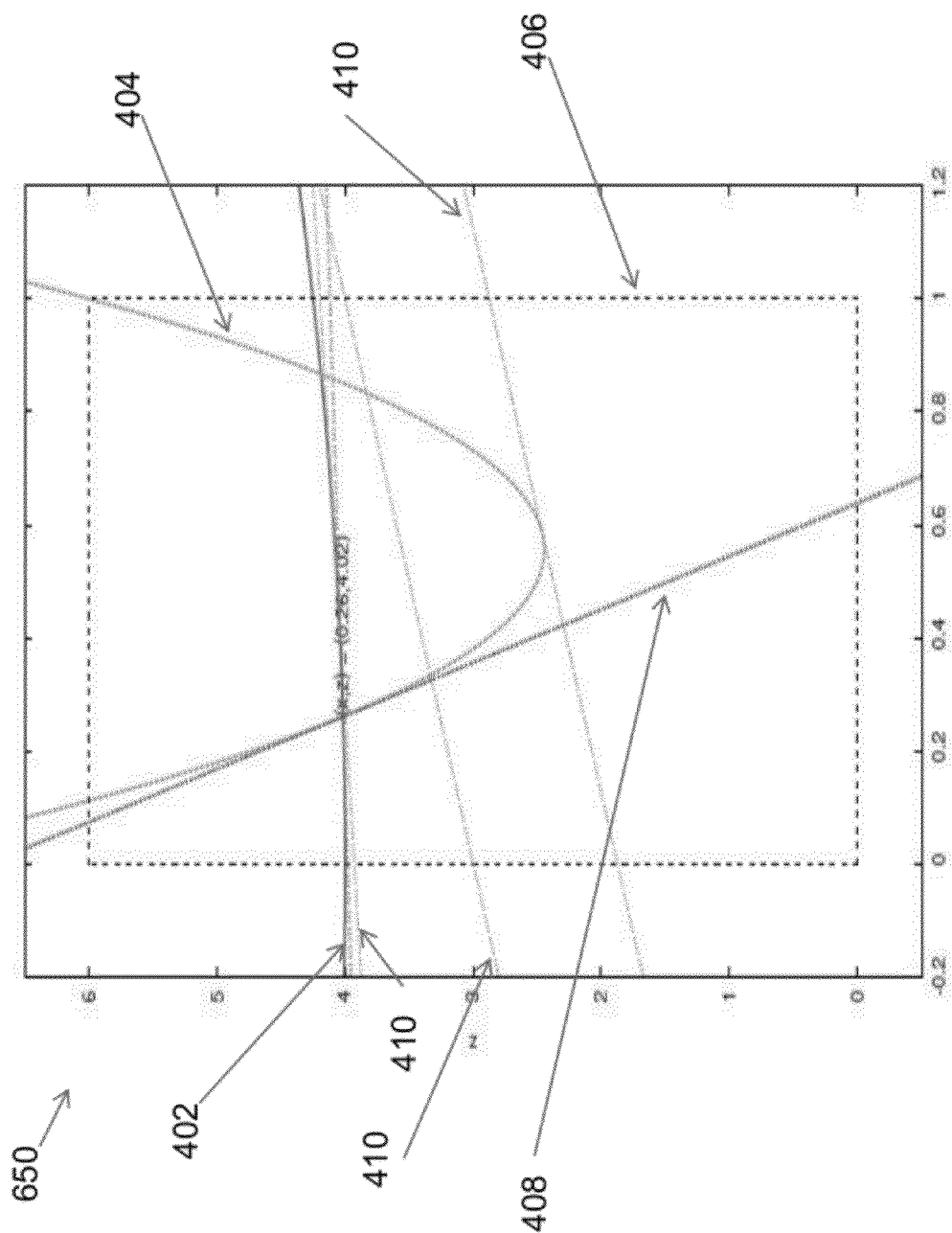
FIG. 11 is a graph depicting another complete iteration of subproblems providing a master problem solution according to an embodiment of the invention.
Figure 12:
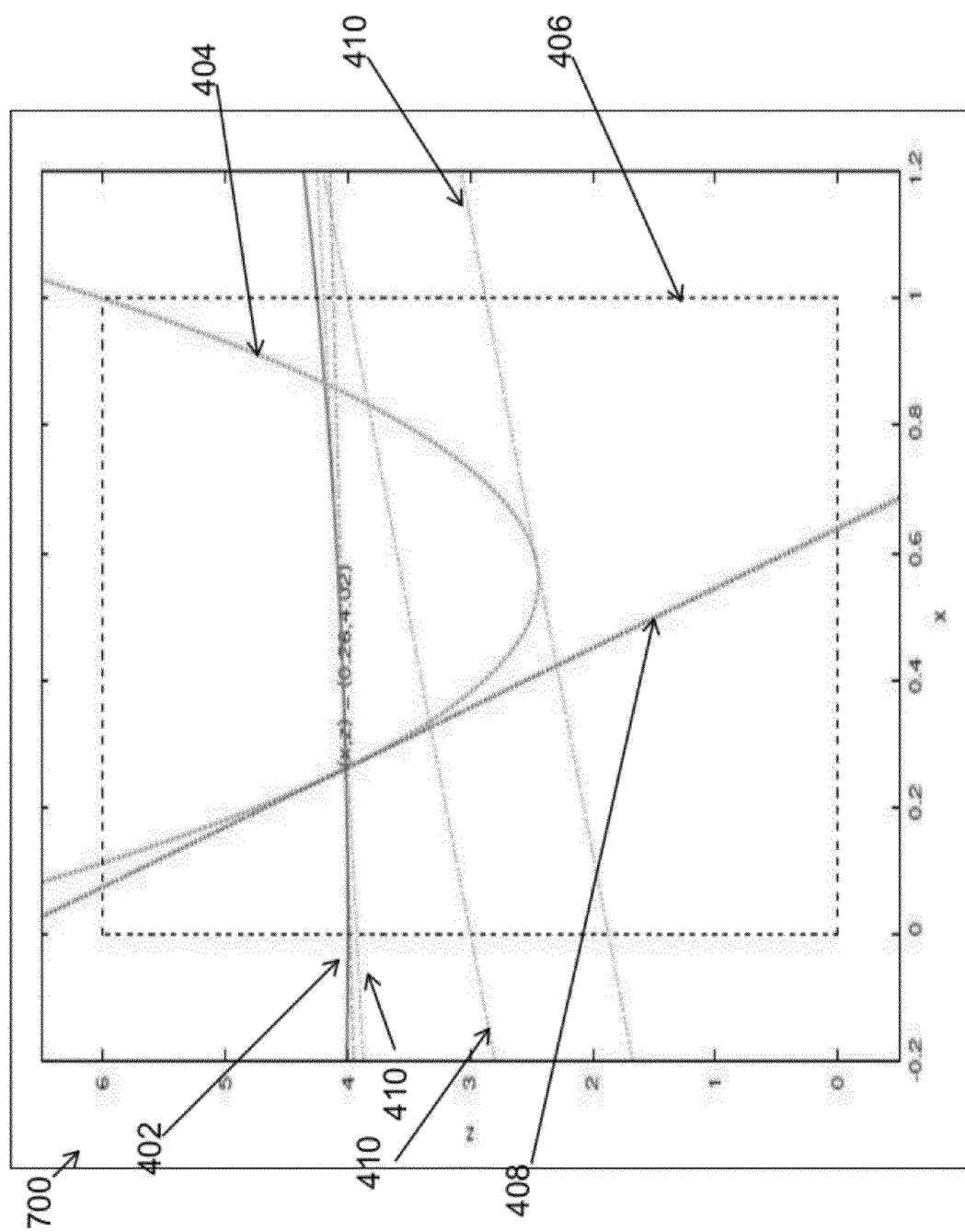
FIG. 12 is a graph depicting a final complete iteration of subproblems providing a final master problem solution according to an embodiment of the invention.

Example: Iteration 1 (cont)

min z s.t. = $0 \leq x \leq 1$ $0 \leq z \leq 6$ $2x + y_1^2 \leq z$ $x + 2y_1 \geq 4$ $0 \leq y_1 \leq 10$ $4x + 2y_2^2 \leq z$ $3x + y_2 \geq 2$ $0 \leq y_2 \leq 10$ -continued Updated(MP):

min z s.t. = $0 \leq x \leq 1$
$0 \leq z \leq 6$
$x - z \leq -3$
$x - z \leq -1.875$ Optimal solution
$(\bar{x}, \bar{z}) = (0, 3)$ A graph 600 of FIG. 10, and corresponding formulas and text below, shows the results of the next complete subproblem-master iteration. The cut generated by the first subproblem is shown as curve 402, and the cut generated by the second subproblem as line 408. The earlier cuts remain in the master problem, and are shown as lines 410 in FIGS. 10-12. The solution of the master problem that results after adding the two new cuts may be represented as x 0.262, y=3.998. This master solution is now quite close to the overall optimum.

Example: Iteration 2 min z
s.t. $0 \leq x \leq 1$
$0 \leq z \leq 6$
$2x + y_1^2 \leq z$
$x + 2_{y1} \geq 4$
$0 \leq y_1 \leq 10$
$4x + 2y_2^2 \leq z$
$3x + y_2 \geq 2$
$0 \leq y_2 \leq 10$ Current (MP) solution:
$(\bar{x}, \bar{z}) = (0, 3)$
Subproblem 1:
Infeasibility: 0.5359
Cut: red line
Subproblem 2:
Infeasibility: 0.7753
Cut: blue line
Solution of updated (MP)
$(\bar{x}, \bar{z}) = (0.262, 3.998)$ A graph 650, referring to FIG. 11, and corresponding formulas and text below ("Example: Iteration 3"), shows the next complete iteration, and the next graph 700, referring to FIG. 12, and the corresponding formulas and text below ("Example: Iteration 4"), show the final complete iteration. When the subproblems are again solved with this final master solution, they are both found to have essentially zero infeasibility, meaning that they are feasible and that the optimal solution has been found.

Example: Iteration 3 min z
s.t. $0 \leq x \leq 1$
$0 \leq z \leq 6$
$2x + y_1^2 \leq z$
$x + 2_{y1} \geq 4$
$0 \leq y_1 \leq 10$
$4x + 2y_2^2 \leq z$
$3x + y_2 \geq 2$
$0 \leq y_2 \leq 10$ Current (MP) solution:
$(\bar{x}, \bar{z}) = (0.262, 3.998)$
Subproblem 1:
Infeasibility: 0.0101
Cut: red line
Subproblem 2:
Infeasibility: 1e-5
Cut: blue line
Solution of updated (MP)
$(\bar{x}, \bar{z}) = (0.260, 4.017)$ Example: Iteration 4 min z
s.t. $0 \leq x \leq 1$
$0 \leq z \leq 6$
$2x + y_1^2 \leq z$
$x + 2_{y1} \geq 4$
$0 \leq y_1 \leq 10$
$4x + 2y_2^2 \leq z$
$3x + y_2 \geq 2$
$0 \leq y_2 \leq 10$ Current (MP) solution:
$(\bar{x}, \bar{z}) = (0.260, 4.017)$
Subproblem 1:
Infeasibility: 1e-5
Subproblem 2:
Infeasibility: 9e-6
Solution of updated (MP)
$(\bar{x}, \bar{z}) = (0.25991, 4.0169)$
Optimal solution of original problem
$(\bar{x}, \bar{z}) = (0.25991, 4.0169)$ Below is a summary of decomposition using Benders, wherein "MP" refers to the master problem. Further below is discussed parallel implementation of subproblems.

Benders Decomposition Recap
Algorithm:
1. Intialize (MP)
2. Solve (MP) to get candidate solution $\bar{x}$
3. For each subproblem i: Minimize infeasibility
  if >0 then add cut to (MP)
4. If all subproblems are sufficiently feasible for $\bar{x}$: CONVERGED
  Otherwise, go to step 2.
Theory: Converges if original problem linear or convex We use it as heuristic for nonconvex JO problems
  subproblems correspond to templates/clips
Parallel Implementation
  All subproblems can be solved independently p1 Once a
(MP) solution is known, cuts can be generated in parallel
  Solution of (MP) is very quick
  Is not a bottleneck in parallelization
  Additional speedup enhancements:
  Switch off a subproblem i if no cut was generated for
    incumbent $\bar{x}$
    It is likely that no cuts are generated for later $\bar{x}$
    At the end, need to verify that final $\bar{x}$ is feasible for
      subproblem i
  Resolve (MP) after only a few cuts have been generated
    ("ASAP")
    Do not need to wait for all subproblems to solve
    Faster update of $\bar{x}$ ⇒ Faster convergence
  Better utilization of parallel resources
Cut Generation Formula

| Minimize infeasibility for subproblem i |
| --- |
| $\min_{y_i} \sum_j \alpha_i^{(j)} + \beta_i^{(j)}$<br>s.t. $B_i(x, y_i) + \alpha_i - \beta_i$    $(INF_i)$<br>$y_i^L \le y_i \le y_i^U$<br>$\alpha_i, \beta_i \ge 0$ |

Figure 4:
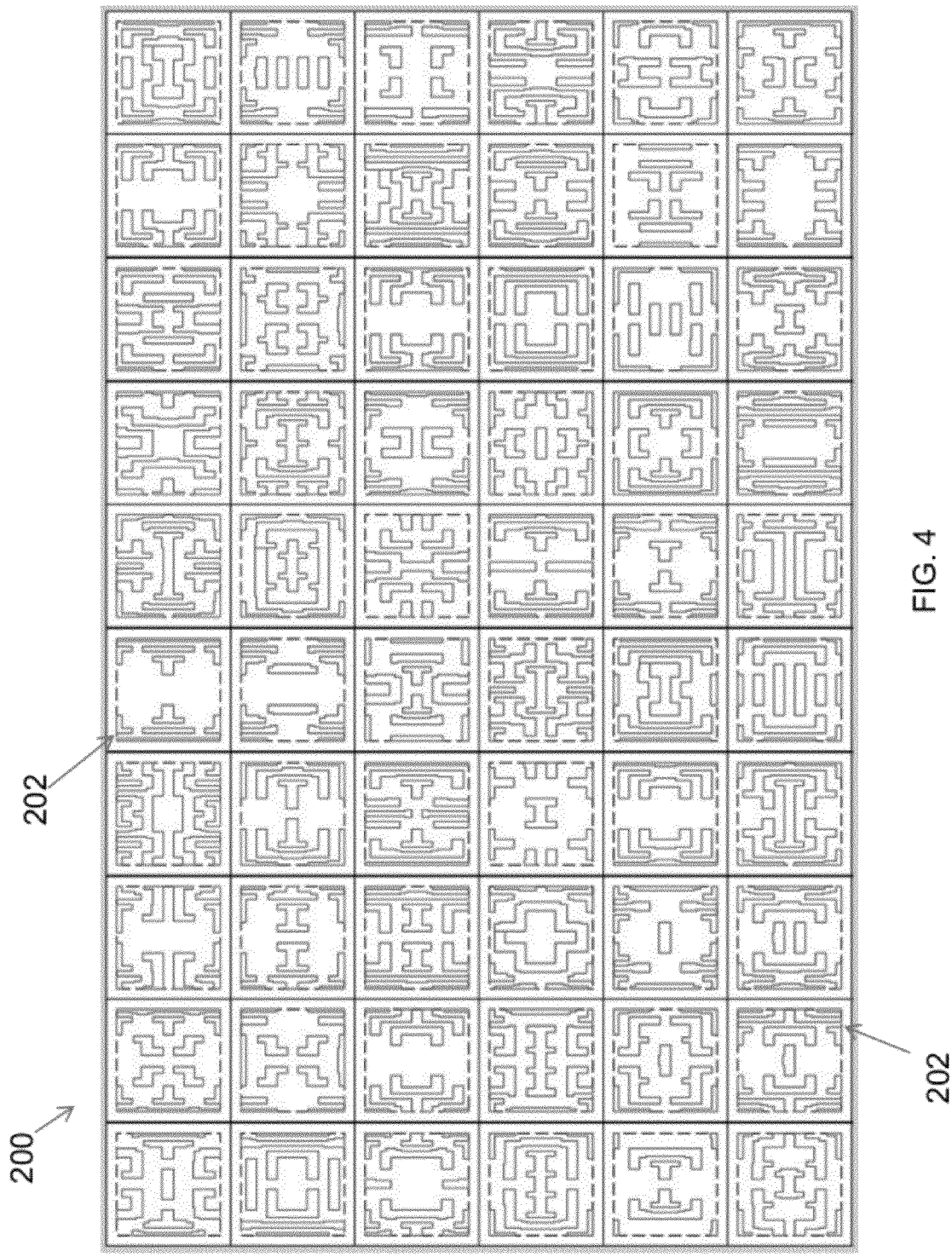
FIG. 4 is plan view of a sample of 60 mask patterns or pattern clips.

$\bar{y}$: optimal solution of $(INF_i)$
$\bar{\pi}$: be optimal constraint multipliers for $(INF_i)$
If $(INF_i)$ objective >0, then compute cut $c_j^T x \le d_j$ from
$c_j = -\bar{\pi}^T \nabla_x B(\bar{x}, \bar{y})^T$
$d_j = \bar{\pi}^T (B(\bar{x}, \bar{y}) - \nabla_x B(\bar{x}, \bar{y})^T \bar{x} - \nabla_y B(\bar{x}, \bar{y})^T \bar{y})$ Referring to FIG. 4, a group of mask patterns 200 include a sample of 60 mask patterns 202 or pattern clips out of a set of 1000 are shown which will be optimized in subproblems.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A method for obtaining mask and source patterns for printing integrated circuit patterns on a semiconductor substrate using a computer including a non-transitory computer readable storage medium encoded with a computer program embodied therein, comprising:
   providing initial representations of a plurality of mask and source patterns;
   identifying long-range and short-range factors in the representations of the plurality of mask and source patterns;
   providing a plurality of clips including a specified number of mask patterns, and specifying short-range factors having overlapping ranges for each of the clips;
   determining an initial processing priority for the plurality of clips;
   determining a patterning relationship between integrated circuit patterns and the mask and source patterns;
   defining a primary objective expressing the printability of the integrated circuit patterns in terms of the patterning relationship;
   defining and iteratively solving at least one master problem employing the primary objective with at least one cut, to generate values for the long-range factors;
   defining and iteratively solving subproblems employing a second objective, using the specified short-range factors from the plurality of clips having a defined processing priority, for generating values for the short-range factors and for generating the cut for the master problem;
   swapping the clips meeting a specified high processing priority into the master problem which were associated with solving subproblems, and swapping the clips not meeting the specified high processing priority from being in the master problem to being associated with the subproblems; and
   generating, by using computer, new masks and source patterns using the values of the long-range and short-range factors according to their representations.

2. The method of claim 1, further comprising:
   adjusting the processing priority of the clips according to a processing priority policy.

3. The method of claim 1, wherein the master problem and subproblems are solved in parallel on a plurality of processors.

4. The method of claim 1, further comprising:
   preventing the clips from being swapped into the master problem using a high processing priority policy which is a fully exclusive policy.

5. The method of claim 1, further comprising a plurality of master problems each employing a primary objective with a plurality of cuts.

6. The method of claim 5, wherein the master problems and subproblems are solved in parallel on a plurality of processors.

7. A computer program product for use with a computer, the computer program product including a non-transitory computer readable storage medium having recorded thereon a computer program or program code, the computer program being executed by a processing unit for obtaining mask and source patterns for printing integrated circuit patterns on a semiconductor substrate, the computer program performing the steps of:
   identifying initial representations of a plurality of mask and source patterns;
   identifying long-range and short-range factors in the representations of the plurality of mask and source patterns;
   providing a plurality of clips including a specified number of mask patterns, and specifying short-range factors having overlapping ranges for each of the clips;
   determining an initial processing priority for the plurality of clips;
   determining a patterning relationship between integrated circuit patterns and the mask and source patterns;
   defining a primary objective expressing the printability of the integrated circuit patterns in terms of the patterning relationship;
   defining and iteratively solving at least one master problem employing the primary objective with at least one cut, to generate values for the long-range factors;
   defining and iteratively solving subproblems employing a second objective, using the specified short-range factors from the plurality of clips having a defined processing priority, for generating values for the short-range factors and for generating the cut for the master problem;
   swapping the clips meeting specified high processing priority into the master problem which were associated with solving subproblems, and swapping the clips not meeting the specified high processing priority from being in the master problem to being associated with the subproblems; and generating new masks and source patterns using the values of the long-range and short-range factors according to their representations.

8. The computer program product of claim 7, further comprising:

adjusting the processing priority of the clips according to a processing priority policy.

9. The computer program product of claim 7, wherein the master problem and subproblems are solved in parallel on a plurality of processors.

10. The computer program product of claim 7, further comprising:

preventing the clips from being swapped into the master problem using a high processing priority policy which is a fully exclusive policy.

11. The computer program product of claim 7, further comprising a plurality of master problems each employing a primary objective with a plurality of cuts.

12. The computer program product of claim 11, wherein the master problems and subproblems are solved in parallel on a plurality of processors.

* * * * *